United States Patent [19]

Ellerson et al.

[11] Patent Number: 5,669,137
[45] Date of Patent: Sep. 23, 1997

[54] METHOD OF MAKING ELECTRONIC PACKAGE ASSEMBLY WITH PROTECTIVE ENCAPSULANT MATERIAL

[75] Inventors: James Vernon Ellerson; Richard Joseph Noreika, both of Endicott; Jack Arthur Varcoe, Endwell, all of N.Y.

[73] Assignee: International Business Machines Corporation, Armonk, N.Y.

[21] Appl. No.: 424,926

[22] Filed: Apr. 19, 1995

Related U.S. Application Data

[60] Division of Ser. No. 252,488, Jun. 1, 1994, Pat. No. 5,469,333, which is a continuation-in-part of Ser. No. 57,205, May 5, 1993, abandoned, which is a continuation of Ser. No. 805,435, Dec. 11, 1991, abandoned.

[51] Int. Cl.$^6$ ...................................................... H05K 3/34
[52] U.S. Cl. .......................... 29/840; 29/841; 228/180.21; 228/214; 257/684; 361/783
[58] Field of Search ................. 29/840, 841; 228/180.21, 228/214; 257/684; 361/783

[56] References Cited

U.S. PATENT DOCUMENTS 3,610,870  10/1971  Sakamoto .............................. 29/832 X
5,414,928   5/1995  Bonitz et al. ........................... 29/840

*Primary Examiner*—Carl J. Arbes
*Attorney, Agent, or Firm*—Lawrence R. Fraley

[57] ABSTRACT

An electronic package assembly wherein a low profile package is soldered to an organic (e.g., epoxy resin) substrate (e.g., printed circuit board). The assembly's projecting conductive leads are soldered. An encapsulant material (e.g., polymer resin) is used to provide reinforcement for the solder-lead connections, the encapsulant material being dispensed only along opposing sides of the package's housing which do not include projecting leads (and which are oriented substantially normal to the stresses imposed on the package during operation wherein high temperatures are attained). This dispensing may follow solder reflow and solidification. The invention is particularly useful with thin, small outline package (TSOP) structures which occupy a minimum of height on the substrate surface.

7 Claims, 3 Drawing Sheets

5,669,137

METHOD OF MAKING ELECTRONIC PACKAGE ASSEMBLY WITH PROTECTIVE ENCAPSULANT MATERIAL

TECHNICAL FIELD

This is a divisional of application Ser. No. 08/252,488, filed Jun. 1, 1994 now U.S. Pat. No. 5,469,333, is a continuation-in-part of Ser. No. 08/057,205, filed May 5, 1993 and now abandoned, which in turn is a continuation of Ser. No. 07/805,435, filed Dec. 11, 1991 and now abandoned.

The present invention relates to electronic packaging structures and particularly to such structures for use within information handling systems (computers). Even more particularly, the invention relates to such package assemblies wherein an electronic package is surface mounted on one of the assembly's organic substrates (e.g., printed circuit board).

CROSS-REFERENCE TO PREVIOUSLY CO-PENDING APPLICATIONS

In Ser. No. 07/493,125, entitled, "Solder Interconnection Structure On Organic Substrates And Process For Making", filed Mar. 14, 1990 (co-inventors R. Hsiao et al), there is defined a solder interconnection structure for joining a semiconductor device (chip) to an organic substrate wherein the gap between the substrate and device is filled with a composition obtained from curing a thermosetting preparation which contains a thermosetting binder and filler having a maximum particle size of only about 50 microns. Ser. No. 07/493,125 is now U.S. Pat. 5,121,190, having issued on Jun 9, 1992.

In Ser. No. 07/782,701, entitled, "Reworkable Module And Method Of Fabricating The Module", filed Oct. 25, 1991 (co-inventors K. Grebe et al), there is defined the use of epoxy encapsulant material for being dispensed between a semiconductor device (chip) and organic substrates. In this application, reworkability of the encapsulant is attained by providing a passivating layer between the epoxy and substrate, which layer is removable (e.g., by reactive ion etching). Parylene and related compounds are utilized as the passivating layer. Ser. No. 07/782,701 is now U.S. Pat. No. 5,274,913, having issued on Jan. 4, 1994.

Both of the above applications are assigned to the same assignee as the present invention.

BACKGROUND OF THE INVENTION

Electronic package assemblies which utilize various organic substrates (e.g., printed circuit boards comprised of epoxy resin or the like material) having one or more electronic packages surface mounted thereon are known. Typically, such electronic packages include a relatively fiat housing component having therein at least one semiconductor device (chip), which semiconductor device is in turn electrically connected to various conductive leads (e.g., copper) which project from designated sides of the housing. One such example is known in the art as a dual in-line package (DIP). Such packages in turn provide various functions (e.g., memory, logic) for the overall system which utilizes package assemblies of this type. Typically, the conductive leads which project from these packages are electrically coupled to respective conductor pads (e.g., copper) or the like which may form the circuitry on an upper surface of the organic substrate. As is known, various solder compositions may be used to provide individual connections between respective pairs of leads and conductors.

Recently, there have been developed electronic packages of relatively low profile which in turn include an insulative housing of relatively thin construction. Such packages are referred to in the art as TSOP's, TSOP standing for thin, small outline package. Such devices, being thin, occupy a minimum of height on the respective organic substrate and are further capable of being surface mounted to the substrate's respective circuitry (e.g., conductor pads) using known (e.g., soldering) techniques. These relatively new packages are known to include memory chips as the semiconductor devices thereof, but may provide other functions (e.g., logic) if desired. Significantly, these recently developed packages are able to provide such functioning while assuring a compact, low profile, thus representing a substantial savings in space for the final product utilizing same.

It has been discovered that when such packages are surface mounted on organic substrates (and particularly those of epoxy resin dielectric material) of relatively thick configuration (e.g., greater than about 0.015 inches thick), relatively significant stress is placed on the solder-lead joints, which stress can in turn adverse effect such joints, possibly causing separation thereof. Such resulting separation in turn my cause disconnection between the lead and solder, possibly rendering the package partially inoperative. Such stress is caused during operation of the package as a result of relatively substantial differences in the coefficients of thermal expansion of the relatively thick organic substrate and the coefficients of expansion of various other elements (e.g., the conductive leads, solder and package housing). Such differences are even more prenounced when thicker organic substrates (e.g., those including several conductive layers therein which function as signal, power or ground planes) are utilized. Thicker substrates are often desired in the computer industry in order to provide additional functioning within a singular member.

It is believed, therefore, that an electronic package assembly which permits the utilization of electronic packages such as those of the TSOP variety to be effectively utilized on organic substrates, and particularly those substrates of relatively thick dimensions, would constitute a significant advancement in the art.

DISCLOSURE OF THE INVENTION

It is, therefore, a primary object of the present invention to enhance the electronic package assembly art.

It is another object of the invention to provide an electronic package assembly which obviates the aforementioned thermal stress problem.

It is yet another object of the invention to provide such a package which can be produced on a relatively large scale, to thus benefit from the several advantages (e.g., lower cost) associated therewith.

In accordance with one aspect of the invention, there is provided an electronic package assembly which comprises an organic substrate including a surface thereon having a plurality of electrical conductors positioned on the surface, an electronic package including an elongated, electrically insulative housing having a lower surface located on or immediately above the surface of the organic substrate and including at least two pair of opposing sides, the package further including first and second pluralities of electrically conductive leads projecting from the opposing sides of a first of the pair of the opposing sides, respectively, and electrically connected to respective ones of the electrical conductors on the surface of the substrate, and a plurality of quantities of solder, each quantity of solder substantially covering one of the conductive leads and at least a portion of a respective one of the electrical conductors to provide an electrical connection therebetween. The assembly further includes encapsulant material located on the surface of the organic substrate and on the opposing sides of a second of the pair of opposing sides of the insulative housing, the encapsulant material not being located on the conductive leads on the opposing sides of said first of the pair of opposing sides. The encapsulant substantially prevents electrical disconnection between the projecting conductive leads and the solder during operation of the electronic package assembly, such disconnections typically caused by stresses occurring due to differences in the coefficients of thermal expansion of said organic substrate, solder and conductive leads during assembly operation.

In accordance with another embodiment of the invention, there is provided a method of making an electronic package assembly, which method comprises the steps of providing an organic substrate including a surface thereon having a plurality of electrical conductors positioned on the surface, positioning an electronic package having an elongated, electrically insulative housing including at least two pair of opposing sides and first and second pluralities of electrically conductive leads projecting from the opposing sides of a first of the pairs of opposing sides, respectively, such that the housing is located on or above the surface of the substrate and the conductive leads are electrically connected to respective ones of the electrical conductors on the surface of the substrate, substantially covering each of the conductive leads and at least a portion of a respective electrical conductor with a quantity of solder, the solder providing an electrical connection between the lead and respective conductor, and position jag a quantity of encapsulant material on the surface of the organic substrate and on the opposing sides of a second of the pairs of opposing sides of the insulative housing. The encapsulant material is not positioned on the conductive leads or the opposing sides of the first pair of the opposing sides, this encapsulant material still serving to substantially prevent electrical disconnection between the projecting conductive leads and the solder during operation of the electronic package assembly. Such disconnections are typically caused by stresses occurring due to differences in the coefficients of thermal expansion of the organic substrate, solder and conductive operation.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
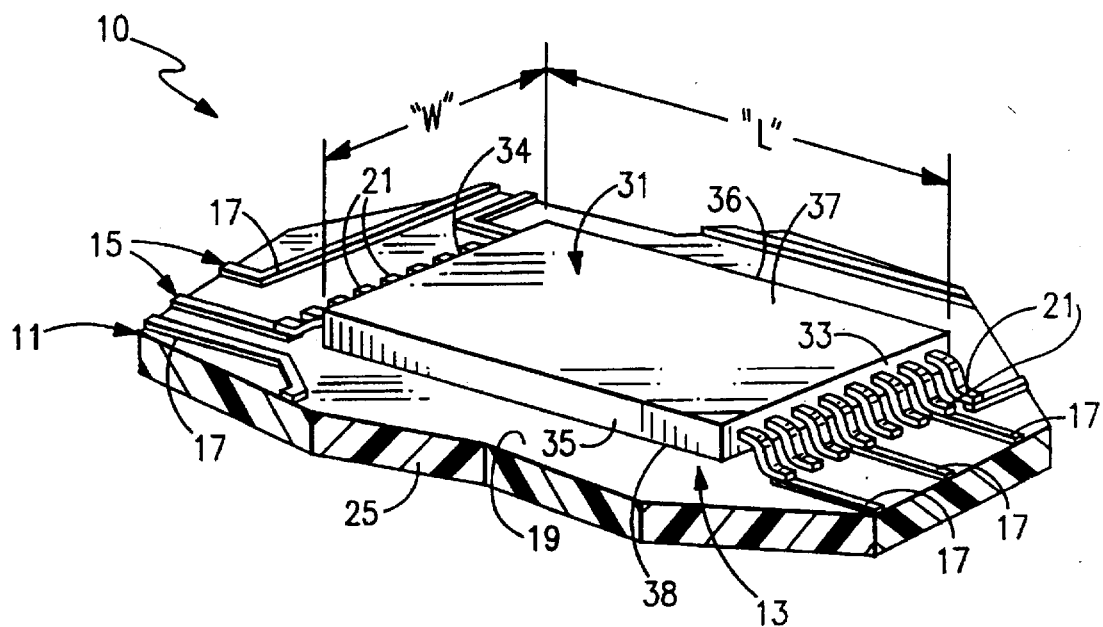
FIG. 1 is a partial perspective view of an electronic package assembly in accordance with one embodiment of the invention, prior to having encapsulant material added thereto (this material being shown in FIGS. 5 and 5A)
Figure 3:
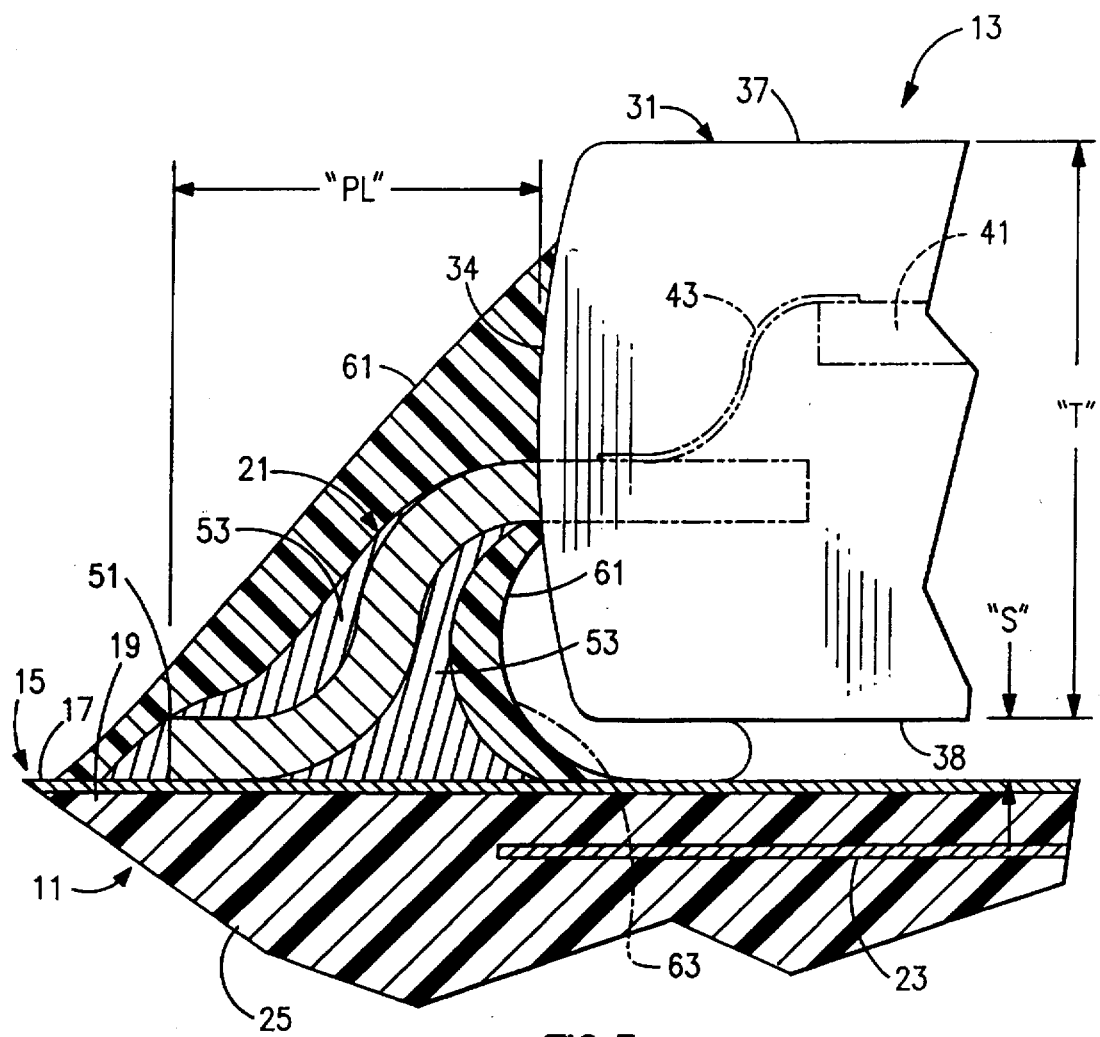
FIG. 3 is a partial elevational view, in section and on a much enlarged scale over the views in FIGS. 1 and 2, illustrating one of the lead-containing sides of the package of FIG. 2 having encapsulant located over the conductive leads projecting therefrom.

In FIG. 1, there is shown a partial view of an electronic package assembly 10 in accordance with a preferred embodiment of the invention. Package assembly 10 includes an organic substrate 11 and an electronic package 13 designed for being positioned on substrate 11 so as to be electrically connected to circuitry 15 thereof. Circuitry 15 is represented, illustratively, as a plurality of electrical conductors 17 located on an upper surface 19 of substrate 11. It is understood that package 13, which includes a plurality of electrically conductive leads 21 projecting from two opposing sides thereof, is designed for being positioned on substrate 11 such that each of the conductor leads 21 is in turn electrically connected to a respective one or more of the conductors 17. Only a few conductors 17 are shown, for illustrative purposes. It is further understood that each lead may be connected to other forms of conductors which my in turn form part of substrate 11, including plated-through-holes having appropriate land sections (not shown), which plated-through-holes are in turn electrically coupled to various internal conductors (e.g., signal, power or ground planes 23, as shown in FIG. 3). Such plated-through-holes, lands, and other conductors are typically comprised of sound conductive material (e.g., copper, chrome-copper-chrome, etc.) and are provided on a surface such as 19 or within substrate 11 in accordance with procedures known in the art and further description is thus not believed necessary.

Figure 5A:
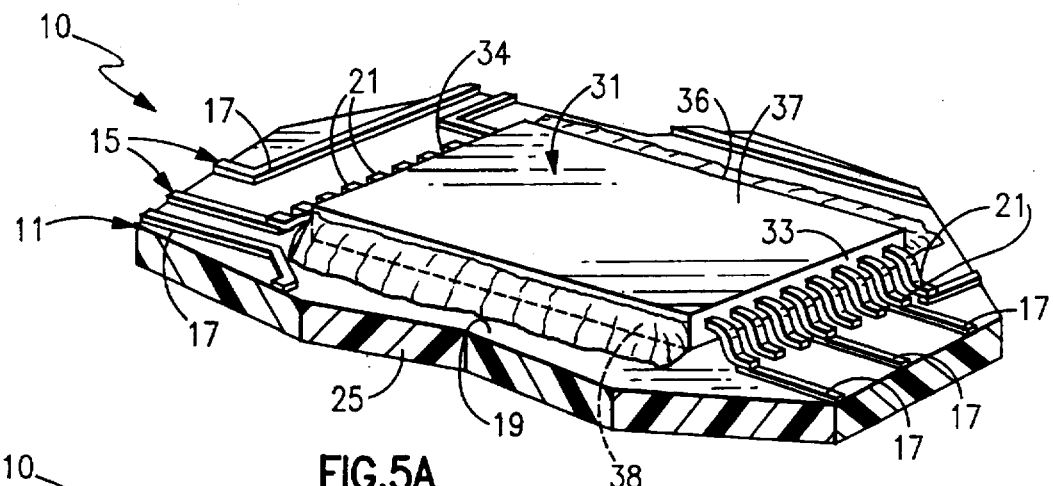
FIG. 5A is a partial perspective view of the invention as defined herein wherein encapsulant is applied to only two opposing sides thereof and not onto the package's leads or against the housing's sides having leads project therefrom, FIG. 5A thereby a perspective view of the package shown in the plan view of FIG. 5.

Organic substrate 11 is preferably a multilayered printed circuit board having circuitry 15 located on its upper surface 19, the board comprised of a dielectric material 25 (see also FIGS. 5A and 7) of known composition. Preferably, this dielectric material is epoxy resin reinforced with fiberglass, also referred to in the industry as FR-4 material. In one example of the invention, substrate 11 may include a total of from about eight to ten individual conductive layers spacedly located within the substrate's dielectric, thereby assuring maximum operational capability for substrate 11. The invention is not limited to this number of conductive layers, however, in that other numbers (more or less) may be provided. Significantly, substrate 11 is of relatively thick construction (e.g., to accommodate the aforementioned several conductive layers). By the term relatively thick is meant to define an organic substrate having a thickness greater than about 0.015 inch. In one example of the invention, substrate 11 may possess a thickness of as great as about 0.062 inch.

Package 13 includes an elongated, electrically insulative housing 31 of known plastic material. The preferred configuration for housing 31 is, as shown in the drawings, substantially rectangular having a total of four sides 33, 34, 35 and 36. In one example of the invention, housing 31 may possess a length (dimension "L" in FIG. 1) of about 0.750 inch and a width (dimension "W" in FIG. 1) of only about 0.300 inch. The longer sides of housing 31 in FIG. 1 are represented by the numerals 35 and 36, whereas the shorter sides are represented by numerals 33 and 34, each of the shorter sides including a plurality (e.g., eight) of the conductive leads 21 projecting therefrom. The invention is not limited to leads projecting from the two shortened sides as shown in FIGS. 1–5A in that leads 21 my also project from the longer sides 35 and 36 for such a package housing, with no leads projecting from the shorter sides, as clearly shown in the alternative package construction in FIG. 6.

Figure 7:
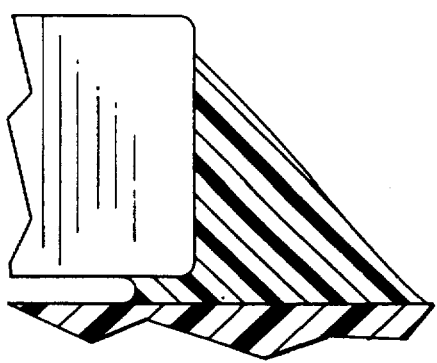
FIG. 7 is an enlarged side view, partly in section, shown encapsulant along one of the opposing sides of the package housing and atop the upper surface of the substrate on which the package is positioned.

Of further significance, housing 31 possesses a thickness of from only about 0.030 inch to about 0.050 inch, this thickness represented by the dimension "T" in FIGS. 3 and 7. Further, housing 31 may be positioned at a slight gap (represented by the dimension "S" in FIG. 3 and also shown in FIG. 7) of only about 0.001 inch to about 0.003 inch from the circuitry 15 on surface 19. In this embodiment, it is thus seen that this relatively flat package occupies a total height of only about 0.033 to about 0.053 inches from the upper surface, including circuitry 17, of substrate 11. Although a small gap is shown in FIGS. 3 and 7, the invention is also applicable to assemblies wherein the plastic housing of package 13 rests directly on (bottoms out) the upper surface 19 and/or circuitry 15.

In addition to the four sides 33, 34, 35 and 36, the flat package housing 31 also includes relatively planar upper and lower surfaces 37 and 38, respectively.

Package 13 further includes a semiconductor device (chip) located within the plastic housing 31. This semiconductor device is represented, illustratively, by the numeral 41 and is shown in phantom in FIG. 3. Preferably, device 41 is electrically connected to the respective conductive leads 21 (only one shown in FIG. 3) by wire bonding or the like, such a wire being represented by the numeral 43 and shown in phantom in FIG. 3. It is understood that device 41 and wire 43 are shown in FIG. 3 for illustration purposes only and not meant to limit the invention to the location, connection or relative sizes depicted. In such a package, each of the projecting conductive leads 21 is internally coupled to a lead frame or the like (not shown) and individually project from the respective sides of the housing in a manner as shown in FIGS. 1, 3, 5 and 6. As such, each of these leads is preferably of the curved configuration particularly shown in the drawings, including having a terminal end 51 which depends downwardly from the package housing for being positioned on substrate 11. As stated, each conductive lead 21 is designed for being electrically coupled to a respective conductor 17 of substrate 11. Each of the conductive leads 21 are preferably of copper and have a thickness of only about 0.010 inch, these leads projecting a distance (dimension "PL" in FIG. 2) of only about 0.025 inch from the respective side (34 in FIGS. 5 and 5A) of housing 31.

To assure sound electrical connection between leads 21 and the respective conductor 17, a quantity of solder 53 is applied to substantially cover each mating pair of leads and conductors. That is, a singnlar quantity of solder is applied to substantially cover one lead and at least a portion of the respective conductor to which lead 21 is electrically coupled. In one example of the invention, each quantity of solder was comprised of 63:37 (tin:lead) solder, this solder known in the art. It is understood that although only one quantity of solder 53 is shown in FIG. 3, that additional quantities are provided to cover the other paired conductor-lead embodiments. Such solder is not shown in FIGS. 1, 5, 5A and 6 for clarity, but is understood to be present. It is understood, therefore, that in the embodiment depicted in FIGS. 1, 5 and 5A, a total of sixteen individual quantities of 63:37 solder will be provided. In FIG. 6, a total of fourteen such quantities will be used. In preferred form, solder 53 is applied to the respective conductor 17 sites in paste form prior to positioning of package 13 on substrate 11. A screening operation is preferably used, following which the package is aligned such that each lead 21 will engage a respective solder paste site. The package and substrate subassembly is then heated using convection, conduction or condensation heat transfer techniques to effect solder paste fellow onto the respective leads, the result being the solder configuration as approximately represented in FIG. 3. A preferred example is a hot air oven using a nitrogen-inerted atmosphere. This preferred temperature for effecting reflow, if using a 63:37 tin:lead solder, is preferably about 200 degrees Celsius (C.). It is understood that this temperature does not adversely affect the package or substrate components. It is understood that the configuration for solder 53 as used herein substantially covers the respective lead 21, almost substantially entirely surrounding the lead. Additionally, solder 53 also covers at least a portion of the conductor 17 on substrate 11. Should conductor 17 be in the form of a land or the like element (which in turn may be electrically coupled to a plated-through-hole extending within substrate 11), it is understood that solder 53 will cover a large portion, if not all of this land conductor.

Figure 2:
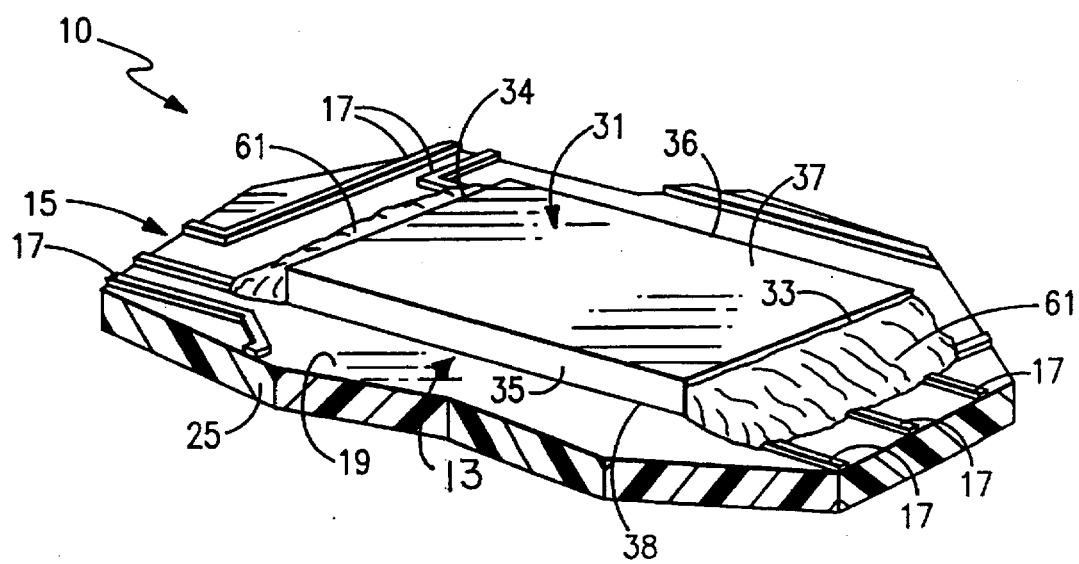
FIG. 2 is a perspective view, similar to FIG. 1, having encapsulant material applied to two opposing sides thereof and onto the electrically conductive leads (not shown) which project from these sides as described in parent application Ser. No. 08/057,205.
Figure 4:
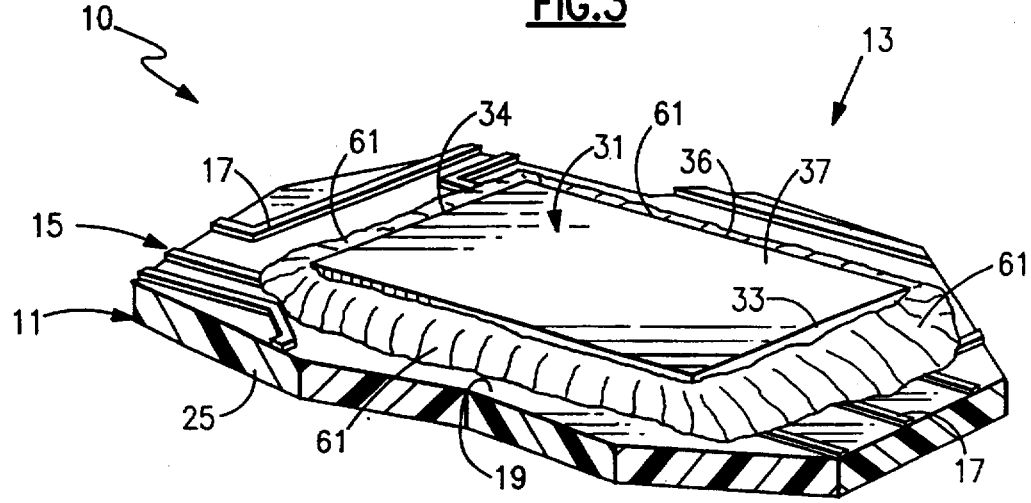
FIG. 4 is a perspective view, similar to the views in FIGS. 1 and 2, showing encapsulant material about the entire periphery (four sides) of a package housing as described in Ser. No. 08/057,205.

In accordance with the teachings in Ser. No. 08/057,205, a quantity of encapsulant material 61 is applied to the lead-containing sides (33 and 34) of housing 31 so as to abut almost these sides and, most significantly, substantially also cover solder 53. Encapsulant material 61, as shown in FIGS. 2 and 3, substantially surrounds the entire quantity of solder 53 for each of the paired lead-conductor combinations. Understandably, the views in FIGS. 2–3 are applicable to the teachings in Ser. No. 08/057,205, wherein it was determined that disconnection between the lead, solder and conductor can be substantially prevented by encapsulant application to the sides of package assembly 10 having leads 21 projecting therefrom (the solder dispensed in the manner defined hereinbelow) as well as entirely around all of the package's sides (FIG. 4).

In accordance with the teachings of the present invention, it has been determined that the provision of encapsulant material 61 to the opposing sides of the package housing not including conductive leads 21 projecting therefrom, instead of in the manner defined in Ser. No. 08/057,205 (over the leads) will provide the highly desired prevention of electrical disconnection between the leads and their respective circuit board conductors (17) during package operation. Specifically, it has been determined that applying such encapsulant to only the opposing sides not having leads projecting therefrom and not also encapsulating the leads will result in an enhanced package having approximately the same life as that defined in Ser. No. 08/057,205, and, most importantly, having a much greater life (see also below) than packages wherein encapsulant is not utilized.

Figure 5:
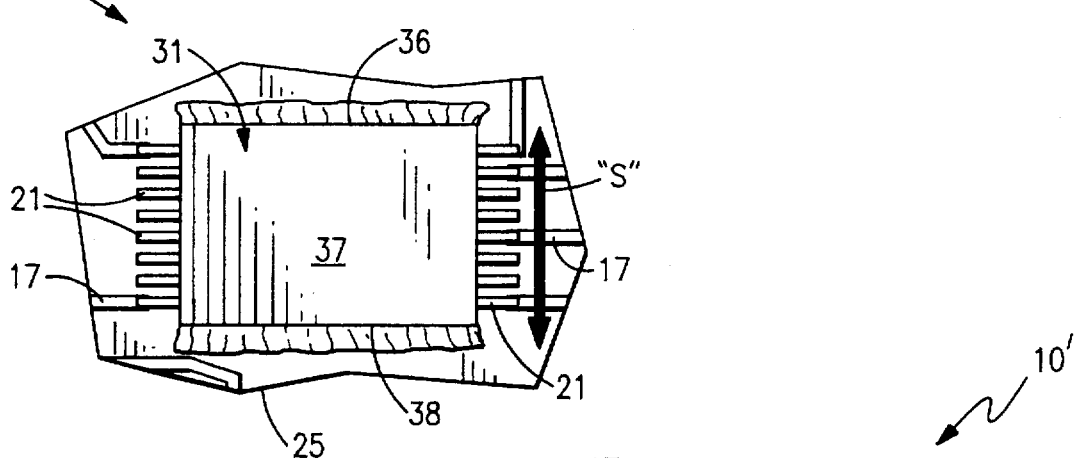
FIG. 5 is a plan view of the package of FIG. 1, having encapsulant material applied thereto in accordance with the teachings of the present invention, and also illustrating the directions of stress imposed on the package during operation.
Figure 6:
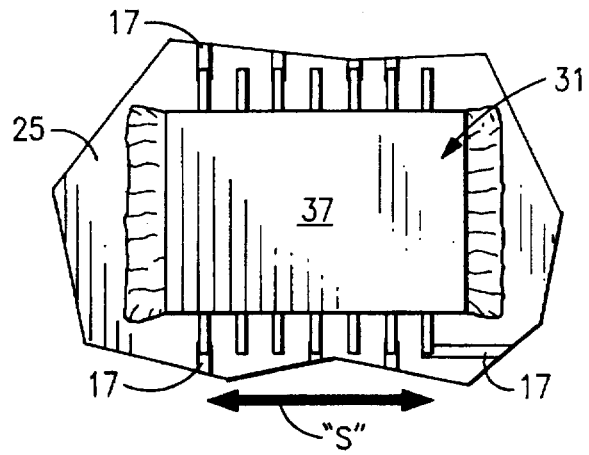
FIG. 6 is a plan view of an alternative embodiment of a package wherein encapsulant has been applied to counter the stresses (indicated by directional arrow) on the package as resulting during operation thereof.

In FIGS. 5 and 6, it is seen that encapsulant 61 is located along the opposing sides not having such leads (35 and 36 in FIG. 5, 33 and 34 in FIG. 6). Investigation has indicated that a rectangular-shaped package of the type shown herein will be subjected to stresses in the substantial direction of the lead pattern (this direction indicated by the letter "S" in FIGS. 5 and 6). Accordingly, it has been determined that providing encapsulant along the sides of the package which are orientated substantially normal to this direction of stress will provide maximum protection against disconnection between the soldered leads and the respective conductors 17, as well as between the leads and covering solder.

As seen in FIGS. 5–7, this encapsulant 61 is dispensed in the form of a fillet and is thus positioned on both the upper surface of the underlying substrate 11 as well as against the respective sides. In FIG. 7, it is also seen that some of this encapsulant may extend under the bottom surface 38 of the package housing 31. Still furthers it is also possible for this encapsulant to extend substantially under the entire surface 38 and thus completely fill the void between this surface and the corresponding upper surface of substrate 11.

During package operation, the aforementioned stresses (thermal type) increase as the package temperature increases. (Such temperature increase is due primarily to the heat generated from the internally-positioned chip.) Through extensive analysis, it was determined that unencapsulated leads fall (disconnect) at less than 1,000 cycles at a temperature range of from about 0 to about 100 degrees C. The aforementioned application Ser. No. 08/057,205 wherein such encapsulant is applied to the leads and alternatively, to both the leads and the other remaining sides of the package, proved to substantially prevent such failure. As understood from the teachings herein the application of such encapsulant to the sides of the package not including the leads will provide substantially the same protection as offered in Ser. No. 08/057,205. The results using the teachings of the instant invention are that package life proved substantially equal to that of packages having the leads encapsulated as taught in Ser. No. 08/057,205, which, in one example, exceeded 5,000 cycles or approximately 5 times those of packages with unencapsulated leads.

Encapsulant 61 is applied in liquid form following the aforementioned solder reflow (and solidification) step. In one embodiment, encapsulant 61 is dispensed using at least one syringe, as occurred in Ser. No. 08/057,205. This dispensing of encapsulant preferably occurs following a pre-heating of the substrate 11 and package 31 located thereon for a predetermined time period. Specifically, the substrate having the package soldered in position thereon, is heated to a range of about 65 degrees C. to about 85 degrees C. (in one particular embodiment, to 75 degrees C.) for about one to two hours, the purpose being to drive off any undesirable moisture which my collect within the dielectric material which forms part of substrate 11. A hot air oven is preferably used to accomplish this heating. Subsequently, encapsulant 61 is dispensed while substrate 11 retains much of the heat from this preheating step. Following encapsulant dispense, the beard with mounted package and encapsulant is positioned within a hot air oven and heated, significantly, to approximately the glass transition temperature of the dielectric material of substrate 11. In one embodiment of the invention, this temperature was within the range of from about 110 degrees C. to about 140 degrees C., and occurred for a period of from three to four hours. Understandably, encapsulant material 61, applied prior to this heating operation, was applied in liquid form.

A preferred encapsulant material for use in the embodiment shown in FIGS. 5–7 (as well as in Ser. No. 08/057,205) is a polymer resin, and particularly an epoxy. By way of example, such an encapsulant is available from the Dexter Corporation (Olean, N.Y.) and sold under the trade name Hysol FP4323. (Hysol is a registered trademark of the Dexter Corporation.) This encapsulant is a flowable, liquid epoxy material which features low viscosity and low stress, both of said features desirable for use with package structures of the type described herein. When properly cured, such encapsulant material provides a low thermal expansion and high glass transition to assure enhanced protection (e.g., during thermal cycling). Hysol FP4323 possesses a coefficient of linear thermal expansion of about $23 \times 10^{-6}$ inch/inch/degrees C. and a glass transition temperature of about 140 degrees C.

The invention is not to be limited to use of the above encapsulant material, however, in that other encapsulants may be successfully used herein. One example of such another encapsulant is Hysol FP4322 having a coefficient of thermal expansion of about $23 \times 10^{-6}$ inch/inch/degrees C. and a glass transition temperature of about 140 degrees C.

As stated it has been discovered that application of encapsulant material of the type described above to the designated locations along only the sides of package housing 31 not having leads 21 projecting therefrom (and thus substantially normal to the stress directions shown in FIGS. 5 and 6) has served to significantly increase the operational life of such package assemblies, particularly those of the low profile configuration described above. As further stated above, operational life was shown to be extended by a factor of about 2–5 times over package assemblies wherein encapsulant was excluded. Such encapsulant has proven to reduce stresses on the lead-solder bond so as to, significantly, substantially prevent separation between the solder and lead elements, which separation in turn may break the connection therebetween and possibly render at least part of the package assembly 10 inoperative. More specifically, this encapsulant material provides such protection during package assembly operation wherein heat is generated by both the substrate and various package elements (e.g. internal silicon chip).

By way of example, the following illustrate the significant differences in the coefficients of thermal expansion (CTE) of the various elements used in one embodiment of the invention.

| ELEMENT | CTE ($\times 10^{-6}$ in/in/°C.) |
| --- | --- |
| Organic Substrate (FR-4) | 17–21 |
| Conductive Leads (Copper Alloy) | 45 |
| Chip Encased In Plastic Housing | 7 |
| Solder | 21 |
| Encapsulant | 23 |

Absent such protection afforded by encapsulant material 11, these substantially different coefficients of expansion can result in cracking or similar deformation of the solder-lead joints, such cracking possibly causing failure thereof. The use of encapsulant material of the type defined herein, applied in the manner described herein (e.g., as in FIGS. 5 and 6), has resulted in a much improved package assembly with prolonged life over non-encapsulated assemblies, and with an approximate same extended life as described in Ser. No. 08/057,205.

Although it is shown in FIG. 7 that encapsulant 61 is spaced a slight distance from the lower part of side 35 of housing 31 (thus forming a gap therebetween), this is not meant to limit the invention. As stated, it is also possible in accordance with the teachings herein to dispense encapsulant material 61 under part or all of the under surface of housing 31, assuming of course housing 31 is spaced at a gap such as depicted in FIG. 7.

It has not been determined necessary to provide encapsulant to the top surface 37.

Thus there has been shown and described an improved electronic package assembly wherein encapsulant material is utilized to reinforce the electrical connections formed between the assembly's package elements and the substrate on which this package is positioned. As stated, such a package assembly has exhibited an operational life substantially greater than non-protected package assemblies (those not including encapsulant or the like material). The package assembly as defined herein is capable of being manufactured using mass production techniques to thus benefit from the advantages thereof. Although the invention has been defined with respect to low profile packages (those having a total height of only about 0.030 inch to about 0.050 inch, it is understood that the teachings herein are readily adaptable to other, higher profile package structures, including many of those well known in the art.

While there have been shown and described what are at present the preferred embodiments of the invention, it will be obvious to those skilled in the art that various changes and modifications may be made therein without departing from the scope of the invention as defined by the appended claims.

We claim:

1. A method of making an electronic package assembly, said method comprising:

providing an organic substrate including a surface thereon having a plurality of electrical conductors positioned on said surface;

positioning an electronic package having an elongated, electrically insulative housing including first and second pairs of opposing sides and first and second pluralities of electrically conductive leads projecting from the opposing sides of said first pair of said opposing sides, respectively, such that said housing is located on or above said surface of said substrate and said conductive leads are electrically connected to respective ones of said electrical conductors on said surface of said substrate, said second pair of said opposing sides not having electrically conductive leads projecting therefrom;

substantially covering each of said conductive leads and at least a portion of a respective electrical conductor with a quantity of solder, said solder providing an electrical connection between said lead and respective conductor; and positioning a quantity of encapsulant material on said surface of said organic substrate and on said opposing sides of said second of said pairs of opposing sides of said insulative housing, said encapsulant material not being positioned on said conductive leads or said opposing sides of said first pair of said opposing sides, said encapsulant material substantially preventing electrical disconnection between said projecting conductive leads and said solder during operation of said electronic package assembly, said disconnection caused by stresses occurring due to differences in the coefficient of thermal expansion of said organic substrate, solder and conductive operation.

2. The method according to claim 1 wherein said solder is applied using a screening operation.

3. The method according to claim 2 wherein said solder is applied in paste form and thereafter heated such that said solder will reflow to thereby substantially cover respective pairs of one of said conductive leads and a respective one of said electrical conductors.

4. The method according to claim 1 wherein said encapsulant material is applied in substantially liquid form and thereafter heated to a pre-established temperature for a predetermined time period sufficient to cure said encapsulant material.

5. The method according to claim 4 wherein said encapsulant material is heated to approximately the glass transition temperature of said organic substrate for said predetermined time period.

6. The method according to claim 5 wherein said preestablished temperature is within the range of from about 110 degrees Celsius to about 140 degrees Celsius.

7. The method according to claim 6 wherein said predetermined time period is from about three to about four hours.

* * * * *